(12) United States Patent
Wang

(10) Patent No.: US 12,218,033 B2
(45) Date of Patent: Feb. 4, 2025

(54) SEMICONDUCTOR STRUCTURE, METHOD FOR FORMING SAME AND STACKED STRUCTURE

(71) Applicant: CHANGXIN MEMORY TECHNOLOGIES, INC., Hefei (CN)

(72) Inventor: Luguang Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 420 days.

(21) Appl. No.: 17/648,903

(22) Filed: Jan. 25, 2022

(65) Prior Publication Data
US 2022/0319959 A1 Oct. 6, 2022

Related U.S. Application Data

(63) Continuation of application No. PCT/CN2021/109149, filed on Jul. 29, 2021.

(30) Foreign Application Priority Data

Apr. 1, 2021 (CN) .......................... 202110357908.8

(51) Int. Cl.
H01L 23/48 (2006.01)
H01L 21/768 (2006.01)
(52) U.S. Cl.
CPC ...... H01L 23/481 (2013.01); H01L 21/76898 (2013.01)
(58) Field of Classification Search
CPC ............. H01L 23/481; H01L 21/76898; H01L 21/7682
See application file for complete search history.

(56) References Cited

U.S. PATENT DOCUMENTS

| 8,779,559 | B2 | 7/2014 | Ramachandran |
| 8,877,559 | B2 | 11/2014 | Gao |
| 9,024,390 | B2 | 5/2015 | Miyajima |
| 9,812,359 | B2 | 11/2017 | Chen |
| 11,018,221 | B2 | 5/2021 | Wong |
| 2013/0134548 | A1* | 5/2013 | Torii ..................... H01L 23/481 257/508 |
| 2013/0221494 | A1 | 8/2013 | Ramachandran |
| 2013/0320562 | A1* | 12/2013 | Miyajima ......... H01L 21/76898 257/774 |

(Continued)

FOREIGN PATENT DOCUMENTS

| CN | 104011848 A | 8/2014 |
| CN | 104137250 A | 11/2014 |

Primary Examiner — Herve-Louis Y Assouman
(74) Attorney, Agent, or Firm — Syncoda LLC; Feng Ma

(57) ABSTRACT

A semiconductor structure includes: a substrate and a dielectric layer, in which the substrate has a front surface and a back surface which are oppositely arranged, and the dielectric layer is formed on the front surface; a connecting hole, penetrating through the substrate and extending to the dielectric layer; an insulating layer, located on the surface of the inner wall of the connecting hole; and a connecting structure, comprising a first barrier layer, a second barrier layer and a conductive structure, in which the first barrier layer is located on a surface of the insulating layer, the second barrier layer is located between the first barrier layer and the conductive structure, and an air gap exists between the second barrier layer and the first barrier layer.

17 Claims, 19 Drawing Sheets

(56) References Cited

U.S. PATENT DOCUMENTS

2014/0264921 A1 9/2014 Gao et al.
2016/0358821 A1* 12/2016 Chen ................ H01L 21/76898
2021/0050412 A1 2/2021 Wong et al.

* cited by examiner

SEMICONDUCTOR STRUCTURE, METHOD FOR FORMING SAME AND STACKED STRUCTURE

CROSS-REFERENCE TO RELATED APPLICATIONS

This is a continuation of International Application No. PCT/CN/2021/109149 filed on Jul. 29, 2021, which claims priority to Chinese Patent Application No. 202110357908.8 filed on Apr. 1, 2021. The disclosures of the above-referenced applications are hereby incorporated by reference in their entirety.

BACKGROUND

A through silicon via (TSV) technology used in three-dimensional packaging can effectively shorten the length of interconnected wires, reduce signal transmission delay and loss, and is one of the effective ways to realize a superior-performance and high-reliability semiconductor device.

A TSV structure usually includes a conductive structure of a metal material (such as copper). After the conductive structure is formed, annealing treatment is required to make sizes of conductive structures more uniform, so as to reduce resistivity and improve electromigration resistance. However, metal particles in the conductive structure may expand due to annealing, which produces thermal stress, and thus causes interface cracks. In order to inhibit the expansion of the metal particles, a barrier layer is usually arranged outside the conductive structure.

However, in the actual processes, the barrier layer often breaks due to the expansion of the metal particles, resulting in semiconductor structure defects.

SUMMARY

The disclosure relates to the technical field of integrated circuits, and in particular to a semiconductor structure, a method for forming the semiconductor structure and a stacked structure.

According to some embodiments, a semiconductor structure, a method for forming the semiconductor structure, and a stacked structure are provided.

A semiconductor structure includes a base, a connecting hole, an insulating layer and a connecting structure.

The base includes a substrate and a dielectric layer, the substrate has a front surface and a back surface which are oppositely arranged, and the dielectric layer is formed on the front surface.

The connecting hole penetrates through the substrate and extends to the dielectric layer.

The insulating layer is located on a surface of an inner wall of the connecting hole.

The connecting structure includes a first barrier layer, a second barrier layer and a conductive structure, in which the first barrier layer is located on the surface of the insulating layer, the second barrier layer is located between the first barrier layer and the conductive structure, and an air gap exists between the second barrier layer and the first barrier layer.

A method for forming a semiconductor structure includes the following operations.

A base is provided, in which the base includes a substrate and a dielectric layer, the substrate is provided with a front surface and a back surface which are oppositely arranged, and the dielectric layer is formed on the front surface.

A connecting hole is formed in the base, and the connecting hole penetrates through the substrate and extends to the dielectric layer.

An insulating layer is formed on a surface of an inner wall of the connecting hole.

A connecting structure is formed on a surface of the insulating layer, in which the connecting structure includes a first barrier layer, a second barrier layer and a conductive structure, the first barrier layer is located on the surface of the insulating layer, the second barrier layer is located between the first barrier layer and the conductive structure, and an air gap exists between the second barrier layer and the first barrier layer.

The above is only an overview of the technical solutions of the disclosure. In order to understand the technical means of the disclosure more clearly and implement it in accordance with the contents of the description, detailed illustration will be described below with better embodiments of the disclosure in combination with the accompanying drawings.

BRIEF DESCRIPTION OF THE DRAWINGS

In order to describe the technical solutions in the embodiments of the disclosure or those in the traditional art more clearly, the accompanying drawings used in descriptions of the embodiments or the traditional art will be simply introduced below. It is apparent that the accompanying drawings described below are only some embodiments of the disclosure. Other drawings may further be obtained by those of ordinary skilled in the art according to these drawings without creative work.

DETAILED DESCRIPTION

Figure 1:
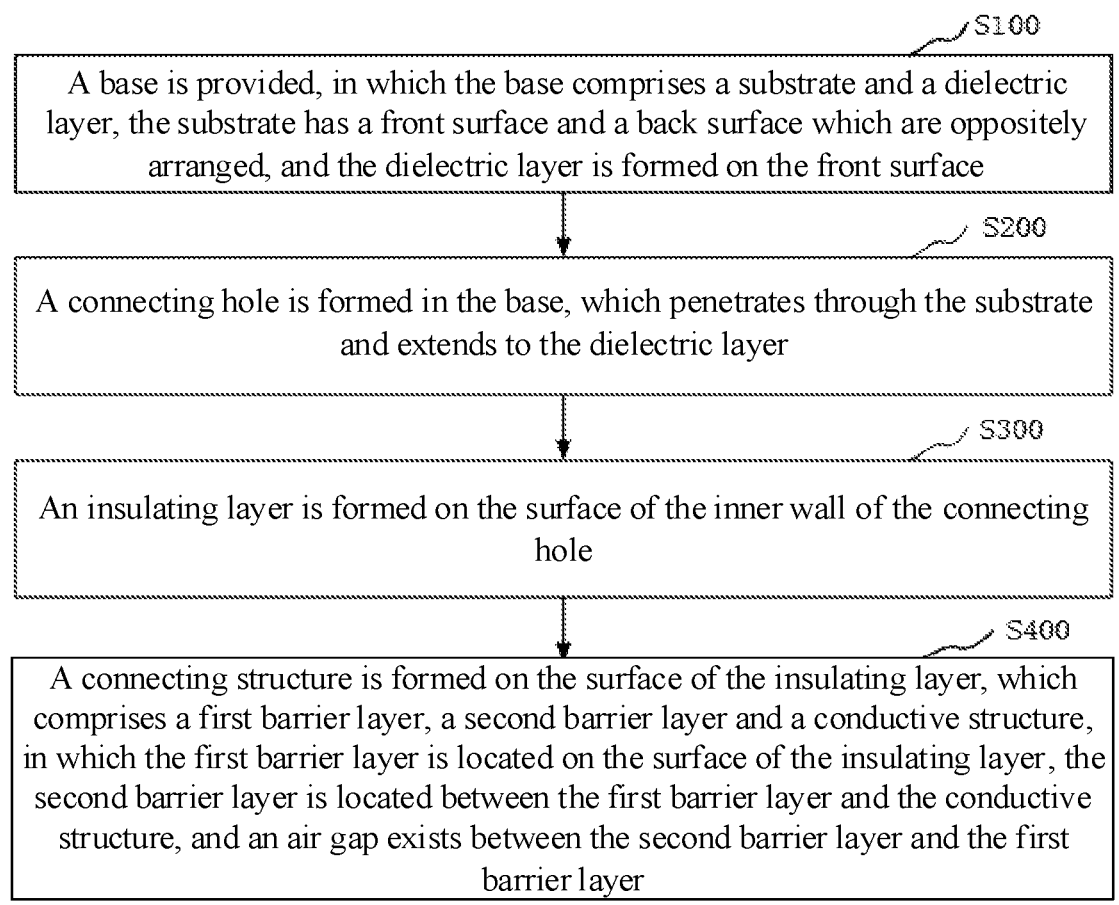
FIG. 1 is a flowchart of a method for forming a semiconductor structure according to an embodiment.

In order to make the disclosure convenient to understand, the disclosure will be described more comprehensively below with reference to the related drawings. The accompanying drawings show embodiments of the disclosure. However, the disclosure may be implemented in various forms and is not limited to the embodiments described herein. On the contrary, these embodiments are provided to make the contents disclosed in the disclosure understood more thoroughly and comprehensively.

Unless otherwise defined, all technical and scientific terms used herein have the same meanings as commonly understood by those skilled in the art that the disclosure belongs to. Herein, terms used in the description of the disclosure are only for the purpose of describing specific embodiments and not intended to limit the disclosure.

Understandably, description that an element or layer is "on", "adjacent to", "connected to", or "coupled to" another element or layer may refer to that the element or layer is directly above, adjacent to, connected to or coupled to the other element or layer, or there may be an intermediate element or layer. On the contrary, description that an element is "directly on", "directly adjacent to", "directly connected to" or "directly coupled to" another element or layer refers to that there is no intermediate element or layer. It is to be understood that, although various elements, components, regions, layers, doping types and/or parts may be described with terms first, second, third, etc., these elements, components, regions, layers, doping types and/or parts should not be limited to these terms. These terms are used only to distinguish one element, component, area, layer, doping type or part from another element, component, area, layer, doping type or part. Therefore, a first element, component, region, layer, doping type or part discussed below may be represented as a second element, component, region, layer or part without departing from the teaching of the disclosure.

Spatially relational terms such as "below", "under", "lower", "beneath", "above", and "upper" may be used herein for describing a relationship between one element or feature and another element or feature illustrated in the figures. It is to be understood that, in addition to the orientation shown in the drawings, the spatially relational terms further include different orientations of devices in use and operation. For example, if the devices in the accompanying drawings are turned over, elements or features described as being "under" or "beneath" or "below" other elements or features will be oriented to be "above" the other elements or features. Therefore, the exemplary terms "under" and "below" may include both up and down orientations. Moreover, the device may include otherwise orientation (such as rotation by 90 degrees or in other orientations) and the spatial descriptors used herein are interpreted accordingly.

As used herein, singular forms "a/an", "one" and "said/the" may include the plural forms, unless otherwise specified types in the context. It is also to be understood that, terms such as "including/comprising" or "having" appoint existence of declarative features, wholes, steps, operations, components, parts or combinations of them, but not excluding the possibility of existence or adding of one or more other features, wholes, steps, operations, components, parts or combinations of them. Meanwhile, in the specification, term "and/or" includes any and all combinations of the related listed items.

Referring to a cross section diagram of a schematic diagram of an ideal embodiment (and an intermediate structure) of the disclosure herein, applied embodiments are described, so that changes of shown shapes due to a manufacturing technology and/or tolerance may be predicted. Therefore, the embodiments of the disclosure should not be limited to specific shapes of shown areas, but including shape deviation due to the manufacturing technology.

In an embodiment, please referring to FIG. 1, a method for forming a semiconductor structure is provided, which include the following operations.

Figure 4:
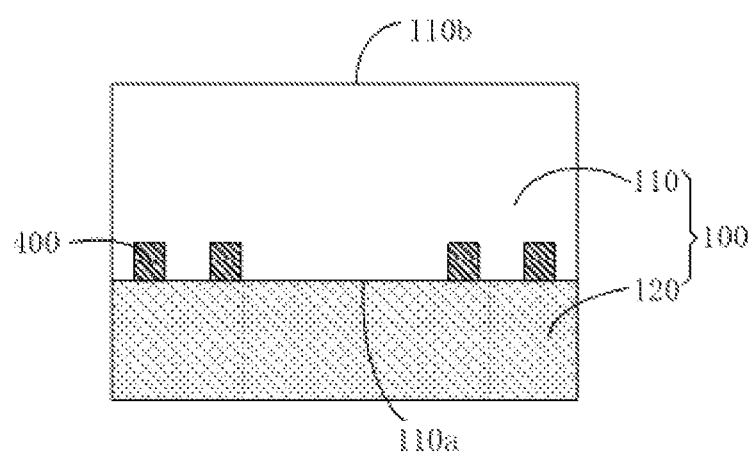
FIG. 4 is a first schematic structural diagram in a semiconductor structure forming process.

At S100, a base 100 is provided, the base 100 includes a substrate 110 and a dielectric base layer 120, the substrate 110 is provided with a front surface 110a and a back surface 110b which are oppositely arranged, and the dielectric base layer 120 is formed on the front surface 110a, please referring to FIG. 4.

Figure 5:
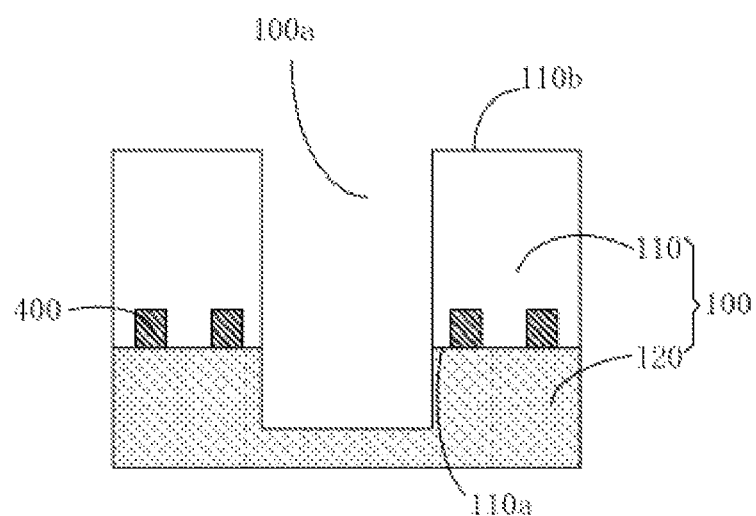
FIG. 5 is a second schematic structural diagram in a semiconductor structure forming process.

At S200, a connecting hole 100a is formed in the base 100, and the connecting hole 100a penetrates through the substrate 110 and extends to the dielectric layer 120, please referring to FIG. 5.

Figure 6:
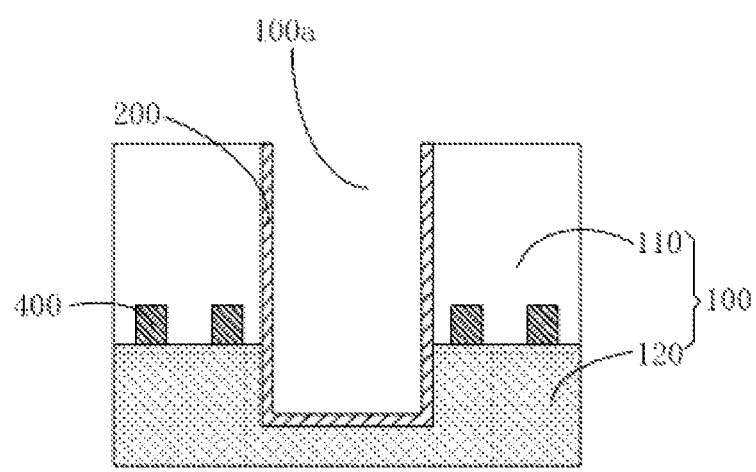
FIG. 6 is a third schematic structural diagram in a semiconductor structure forming process.

At S300, an insulating layer 200 is formed on the surface of the inner wall of the connecting hole 100a, please referring to FIG. 6.

Figure 17:
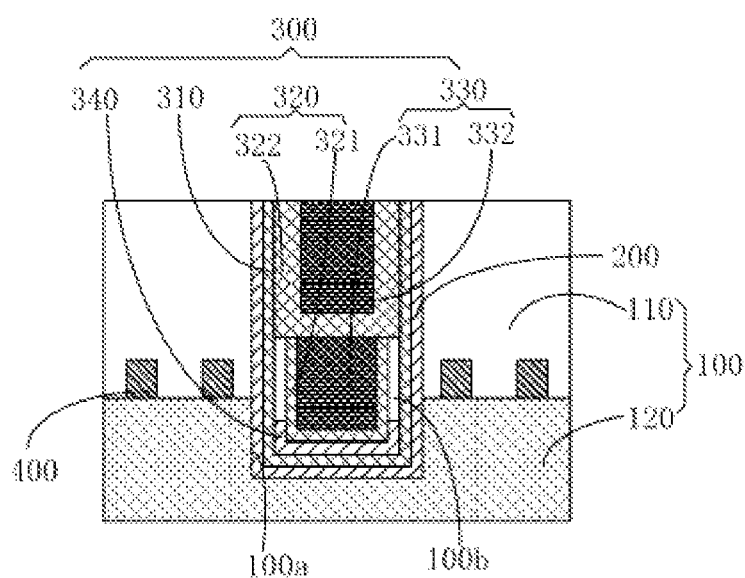
FIG. 17 is a first schematic diagram of semiconductor structures in different embodiments.
Figure 18:
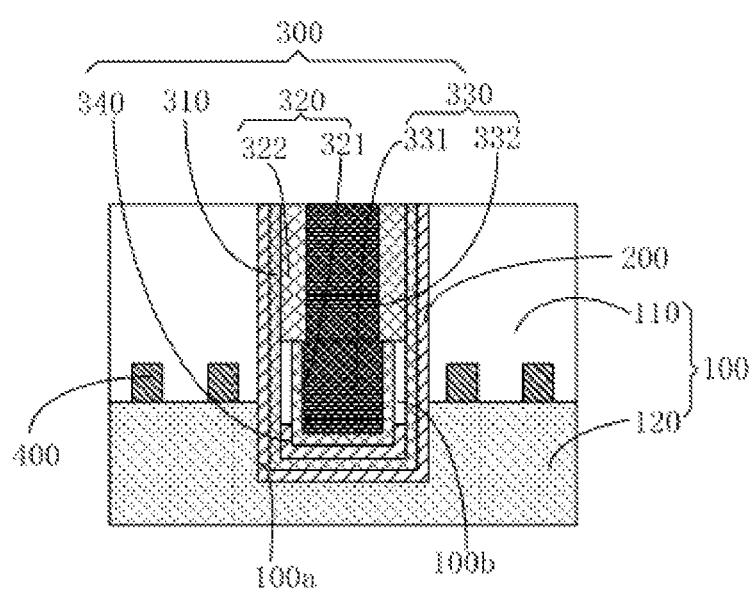
FIG. 18 is a second schematic diagram of semiconductor structures in different embodiments.
Figure 19:
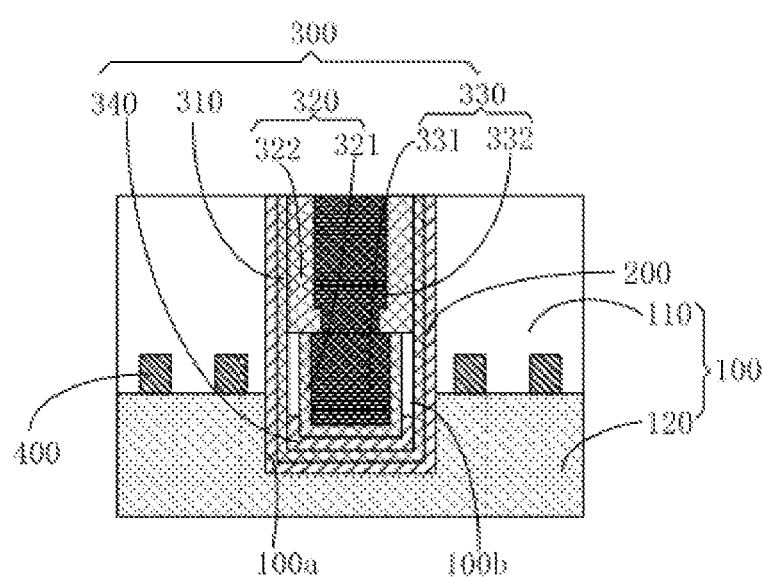
FIG. 19 is a third schematic diagram of semiconductor structures in different embodiments.

At S400, a connecting structure 300 is formed on the surface of the insulating layer 200, the connecting structure 300 includes a first barrier layer 310, a second barrier layer 320 and a conductive structure 330, the first barrier layer 310 is located on the surface of the insulating layer 200, the second barrier layer 320 is located between the first barrier layer 310 and the conductive structure 330, and an air gap exists between the second barrier layer 320 and the first barrier layer 310, please referring to FIG. 17 to FIG. 19.

In S100, the substrate 110 may include, but is not limited to, a silicon substrate. Shallow trench isolation structures 400 may be formed at the side of the substrate 110 close to the dielectric layer 120. The shallow trench isolation structures 400 isolate the substrate 110 into a plurality of active areas. The active areas are configured to form various semiconductor devices.

The dielectric layer 120 may include, but is not limited to, an oxide dielectric layer (such as silicon dioxide, etc.). Interconnecting hole structures and a metal layer electrically connected with the active areas may be formed in the dielectric layer 120, so as to lead out a signal of a semiconductor device or provide an external signal to the semiconductor device.

In S200, the interior of the connecting hole 100a is configured to form a connecting structure 300. When chips formed by a plurality of semiconductor structures are stacked, the corresponding connecting holes 100a of the respective chips are aligned, so that the connecting structures 300 in the respective connecting holes 100a are electrically connected, and thus interconnection between the chips is realized.

In S300, the insulating layer 200 is located between the connecting structure 300 and the inner wall of the connecting hole 100a, so as to realize electrical isolation between the connecting structure 300 and the substrate 110. The material of the insulating layer 200 may be silicon dioxide, etc. The material of the insulating layer 200 and the material of the dielectric layer 120 may be the same or different.

When the material of the insulating layer 200 may be silicon dioxide, specifically, by a chemical vapor deposition (CVD) method based on silane (SiH$_4$) or tetraethoxysilane (TEOS), a silicon dioxide film layer is deposited on the inner wall of the connecting hole 100*a* as the insulating layer 200. The thickness of the silicon dioxide film layer may be 0.2 μm-2 μm.

In S400, all of the first barrier layer 310, the second barrier layer 320 and the conductive structure 330 of the connecting structure 300 are structures capable of performing conductive communication.

The material of the first barrier layer 310 may be tantalum (Ta), tantalum nitride (TaN), etc., and its thickness may be 0.05 μm-0.1 μm. It can effectively reduce the thermal expansion coefficient of the conductive structure 330 when the conductive structure 330 generates thermal expansion.

The material of the second barrier layer 320 may also be Ta, TaN, etc., and its thickness may be 0.05 μm-0.1 μm. It also can effectively reduce the thermal expansion coefficient of the conductive structure 330 when the conductive structure 330 generates thermal expansion.

It should be understood that, the material and/or the thickness of the first barrier layer 310 and the second barrier layer 320 may be the same or different. Moreover, the material and/or the thickness of different sections of the first barrier layer 310 and/or the second barrier layer 320 may be the same or different, which is not limited in the disclosure.

The material of the conductive structure 330 may be a metal material with good conductivity (such as Cu).

In the embodiment, two barrier layers (the first barrier layer 310 and the second barrier layer 320) are arranged between the insulating layer 200 and the conductive structure 330, so that the strength of the barrier layer may be effectively increased, so as to prevent it from breaking during annealing of the conductive structure 330.

Meanwhile, an air gap 100*b* is formed between the second barrier layer 320 and the first barrier layer 310 connected with the conductive structure 330. Therefore, even if the second barrier layer 320 on one side of the air gap 100*b* is cracked due to the expansion of the conductive structure 330, and the air gap 100*b* may effectively prevent the crack from continuing to extend, so as to effectively prevent the first barrier layer 310 on the other side of the air gap 100*b* form fracturing.

Therefore, the disclosure may effectively prevent the fracture of the barrier layer, so as to effectively inhibit the grain size of the conductive structure 330 and reduce the surface roughness of the annealed conductive structure, and then reduce the generation of interface stress.

Moreover, the air thermal conductivity is poor. Therefore, the disclosure may also effectively prevent heat generated by the conductive structure from diffusing to the surrounding substrate 110 and/or dielectric layer 120.

In an embodiment, please referring to FIG. 5, S200 may include that the base 100 is etched from the back surface 110*b* of the substrate 110 to form a connecting hole 100*a*.

As an example, by a dry etching process, the substrate 110 and the dielectric layer 120 are sequentially etched from the back surface 110*b* of the substrate 110, so as to form a connecting hole 100*a*. The depth of the connecting hole 100 may be 20 μn-150 μm, and the depth of the connecting hole 100 extending into the dielectric layer 120 may be 0.5 μm-1 μm. The diameter of the connecting hole 100 may be 3 μm-50 μm. The depth-to-width ratio (namely a ratio of the depth to the diameter) of the connecting hole 100 may be 0.4-50.

Since the back surface 110*b* of the substrate 110 is far away from the semiconductor devices formed in the active areas and circuit structures connecting the semiconductor devices, the embodiment may effectively prevent damage to the semiconductor devices formed in the active areas and the related circuit structures when the connecting hole 100*a* is formed.

In an embodiment, please referring to FIG. 17 or FIG. 18 or FIG. 19, the air gap 100*b* formed in S400 penetrates through the interface between the substrate 110 and the dielectric layer 120.

Semiconductor devices are dense around the interface between the substrate 110 and the dielectric layer 120, and the semiconductor device structures usually penetrate through the interface between the substrate 110 and the dielectric layer 120 and are located at the both sides.

In the embodiment, the air gap 100*b* penetrating through the interface between the substrate 110 and the dielectric layer 120 can effectively prevent the crack of the barrier layer from extending to the substrate 110 and/or the dielectric layer 120 near the interface. Therefore, the embodiment may also effectively protect the semiconductor devices around the air gap 100*b*.

In an embodiment, the width of the portion of the air gap 100*b* corresponding to the dielectric layer 120 is less than the width of the portion corresponding to the substrate 110.

The dielectric layer 120 is a film layer formed on the substrate 110, and its thickness is much smaller than that of the substrate 110. Therefore, in the embodiment, the width of the portion of the air gap 100*b* corresponding to the dielectric layer 120 is relatively small, so that the structural instability of the dielectric layer 120 caused by the air gap 100*b* may be effectively prevented.

Moreover, heat generated in the dielectric layer 120 is relatively large when the devices work. At this time, by setting the larger width of the air gap 100*b* corresponding to the substrate 110, the heat flows to the position of the larger gap, thus it is more conducive to heat dissipation and the influence on peripheral devices is avoid.

In an embodiment, the connecting structure 300 may also include an isolation layer 340. Please referring to FIG. 2, S400 may include the following operations.

Figure 7:
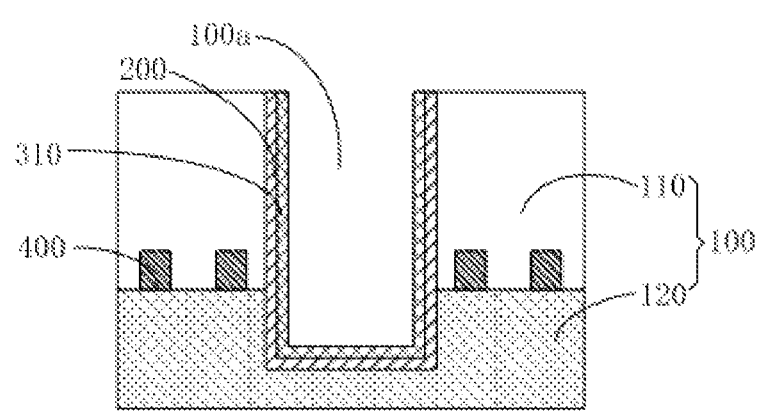
FIG. 7 is a fourth schematic structural diagram in a semiconductor structure forming process.

At S411, the first barrier layer 310 is formed on the surface of the insulating layer 200, please referring to FIG. 7.

Figure 8:
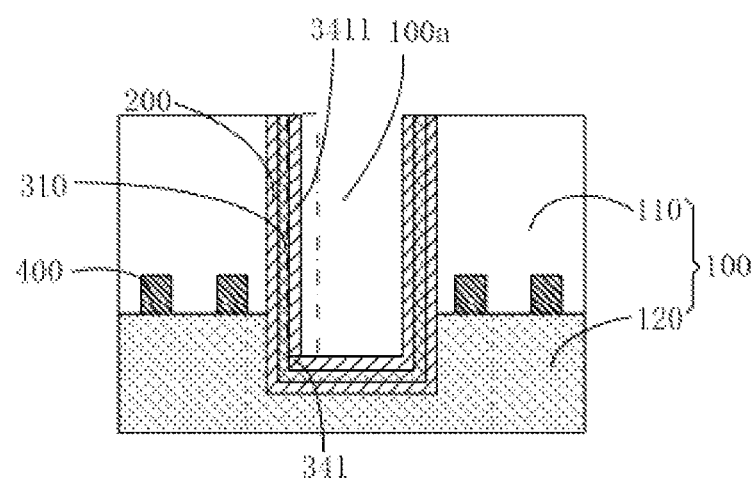
FIG. 8 is a fifth schematic structural diagram in a semiconductor structure forming process.

At S412, a primary isolation layer 341 is formed on the surface of the first barrier layer 310, and the primary isolation layer may include a side wall part 3411, please referring to FIG. 8.

Figure 9:
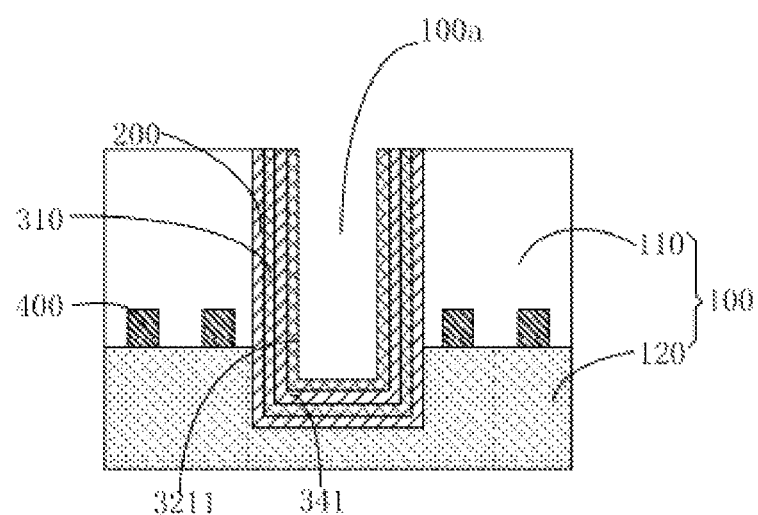
FIG. 9 is a sixth schematic structural diagram in a semiconductor structure forming process.

At S413, a primary barrier layer 3211 is formed on the surface of the primary isolation layer 341, please referring to FIG. 9.

Figure 10:
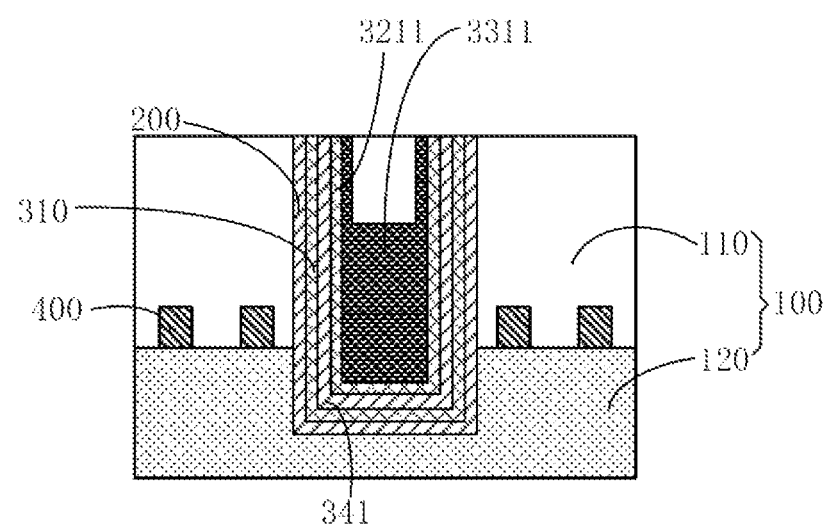
FIG. 10 is a seventh schematic structural diagram in a semiconductor structure forming process.

At S414, a primary conductive layer 3311 is formed on the surface of the primary barrier layer 3211, please referring to FIG. 10.

Figure 11:
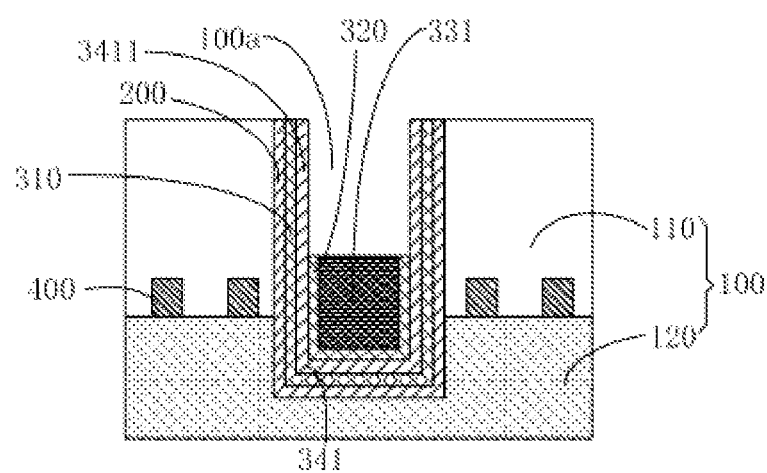
FIG. 11 is an eighth schematic structural diagram in a semiconductor structure forming process.

At S415, part of the primary conductive layer 3311 and part of the primary barrier layer 3211 are removed to expose part of the side wall part 3411, the retained part of the primary conductive layer 3311 constitutes a first conductive layer 331, and the retained part of the primary barrier layer 3211 constitutes a second barrier layer 320, please referring to FIG. 11.

Figure 12:
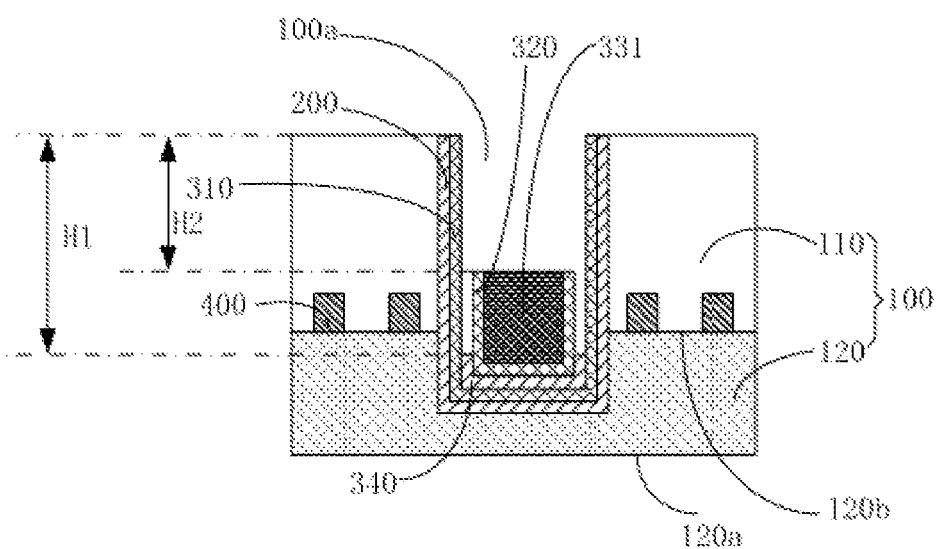
FIG. 12 is a ninth schematic structural diagram in a semiconductor structure forming process.

At S416, part of the side wall part 3411 is removed, the retained part of the primary isolation layer 341 constitutes an isolation layer 340, and the distance H1 between the to surface of the isolation layer 340 and an opening of the connecting hole 100*a* is greater than the distance H2 between the top surface of the second barrier layer 320 and the opening of the connecting hole 100*a*, please referring to FIG. 12.

Figure 13:
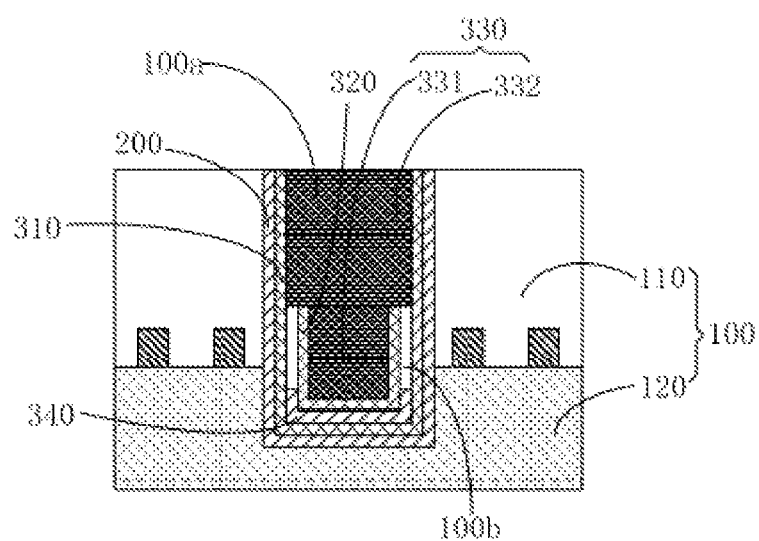
FIG. 13 is a tenth schematic structural diagram in a semiconductor structure forming process.

At S417, a second conductive layer 332 is formed on the surface of the first barrier layer 310, the surface of the second barrier layer 320 and the surface of the first conductive layer 331, and the second conductive layer 332 and the first conductive layer 331 constitute a conductive structure 330, please referring to FIG. 13.

The first barrier layer 310, the isolation layer 340, the second barrier layer 320 and the second conductive layer 332 of the conductive structure 330 are arranged together defining the air gap 100b, and the air gap 100b is sealed by the second conductive layer 332 of the conductive structure 330.

In S411, the first barrier layer 310 may be formed by a physical vapor deposition (PVD) method. The material of the primary barrier layer 2111 may be Ta and TaN. The thickness of the primary barrier layer 2111 may be 0.05 µm-0.1 µm.

In S412, the material of the primary isolation layer 341 may be an insulating material to facilitate the formation of the air gap 100b. Certainly, the material of the primary isolation layer 341 may also be a conductive material, etc., and there is no limitation in the disclosure.

As an example, the material of the primary isolation layer 341 is silicon dioxide. Specifically, a silicon dioxide film layer with the thickness of 0.2 µm-2 µm may be deposited on the inner wall of the connecting hole 100a as the primary isolation layer 341 by a CVD method based on $SiH_4$ or TEOS.

In S413, similar to the first barrier layer 310, the primary barrier layer 3211 may also be formed by the PVD method. The material of the primary barrier layer 3211 may be Ta and TaN. The thickness of the primary barrier layer 3211 may be 0.05 µm-0.1 µm.

In S414, the material of the primary conductive layer 3311 may be metallic Cu and the like. Specifically, a Cu seed crystal layer is formed on the surface of the primary barrier layer 2111 by the PVD method at first. Afterwards, electroplated Cu grows on the surface of the Cu seed crystal layer by electroplating. The Cu seed crystal layer and the electroplated Cu together constitute the primary conductive layer 3311.

More specifically, since part of the primary conductive layer 3311 is also required to be removed in the subsequent step S415 to form an air gap 100b, in this case, the primary conductive layer 3311 growing on the surface of the primary barrier layer 2111 may not fully fill the connecting hole 100a. As an example, the filling thickness of the central portion of the primary conductive layer 3311 may be 20%-70% of the depth of the connecting hole 100a.

In S415, part of the primary barrier layer 3211 and part of the primary conductive layer 3311 covering the side wall part 3411 may be removed by a mixed acid solution, so that the side wall part 3411 of the primary isolation layer 341 is partially exposed, and the second barrier layer 320 and the first conductive layer 331 are formed at the same time.

After the side wall part 3411 of the primary isolation layer 341 is partially exposed, S416 is executed, so that the isolation layer 340, the surface of which is lower than the surface of the second barrier layer 320, is formed more easily, and thus the air gap 100b may be realized more easily.

In S416, the side wall part 3411 of the primary isolation layer 341 (such as a silicon dioxide film layer) in the connecting hole 100a may be etched by hydrofluoric acid or dry etching to form the isolation layer 340.

Specifically, after part of the primary isolation layer 341 is removed, the distance H1 between the surface of the isolation layer 340 formed by the remaining primary isolation layer 341 and an opening of the connecting hole 100a is greater than the distance H2 between the surface of the second barrier layer 320 and the opening of the connecting hole 100a. That is, according to the direction as shown in FIG. 12, after part of the primary isolation layer 341 is removed, the surface of the isolation layer 340 formed by the remaining primary isolation layer 341 is lower than the surface of the second barrier layer 320.

In S417, specifically, the material of the second conductive layer 332 and the material of the first conductive layer 331 may be the same or different certainly, which is not limited in the disclosure.

As an example, when the material of the second conductive layer 332 and the material of the first conductive layer 331 are both Cu, the formation process of the second conductive layer 332 may be similar to that of the first conductive layer 331. The Cu seed crystal layer may be formed at first, and then Cu may be electroplated on the Cu seed crystal layer for further processing to from the second conductive layer 332.

Specifically, the air gap 100b may be sealed by the Cu seed crystal layer of the second conductive layer 332.

In the embodiment, the primary isolation layer 341 is formed, and then part of the side wall part 3411 thereof is removed, so that an air gap may be formed between the two barrier layers (the first barrier layer 310 and the second barrier layer 320) conveniently and effectively.

Moreover, in the embodiment, the first conductive layer 331 and the second conductive layer 332 of the conductive structure 330 are formed in two sections, and then the second barrier layer 320 may be formed simply, conveniently and feasibly while the first conductive layer 331 is formed, so as to facilitate the formation of the air gap 100b. Moreover, when the first conductive layer 331 and the second conductive layer 332 of the conductive structure 330 are formed in two sections, in a process of forming the first conductive layer 331, the height of the formed air gap 100b may be conveniently adjusted by controlling the etching height of the primary conductive layer 3311 and the primary barrier layer 3211.

Certainly, the formation manner of the conductive structure 330 is not limited to this. In other embodiments, the conductive structure 330 may also be formed at one time, and then the first barrier layer 310, the isolation layer 340, the second barrier layer 320 and the conductive structure 330 are arranged together defining the air gap 100b, and the air gap 100b is sealed by the conductive structure 330.

In an embodiment, the connecting structure 300 also includes an isolation layer 340. Please referring to FIG. 3, S400 may include the following operations.

At S421, the first barrier layer 310 is formed on the surface of the insulating layer 200, please referring to FIG. 7.

At S422, a primary isolation layer 341 is formed on the surface of the first barrier layer 310, and the primary isolation layer may include a side wall part 3411, please referring to FIG. 8.

At S423, a primary barrier layer 3211 is formed on the surface of the primary isolation layer 341, please referring to FIG. 9.

At S424, a primary conductive layer 3311 is formed on the surface of the primary barrier layer 3211, please referring to FIG. 10.

Figure 14:
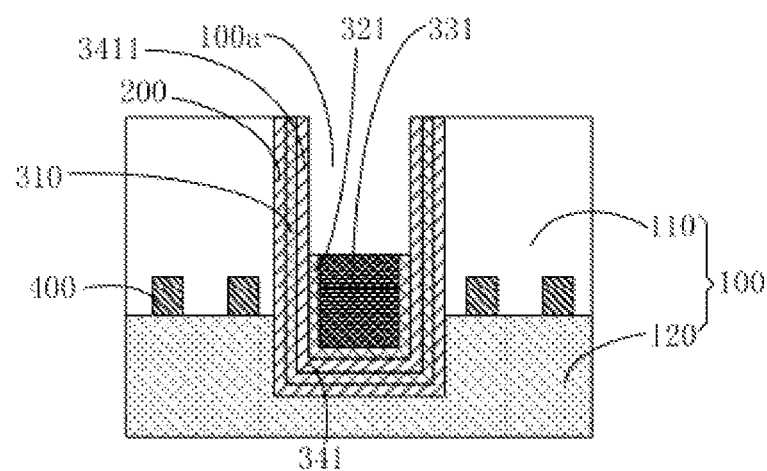
FIG. 14 is an eleventh schematic structural diagram in a semiconductor structure forming process.

At S425, part of the primary conductive layer 3311 and part of the primary barrier layer 3211 are removed to expose part of the side wall part 3411, the retained part of the primary conductive layer 3311 constitutes a first conductive layer 331, and the retained part of the primary barrier layer 3211 constitutes a first sub-layer 321, please referring to FIG. 14.

Figure 15:
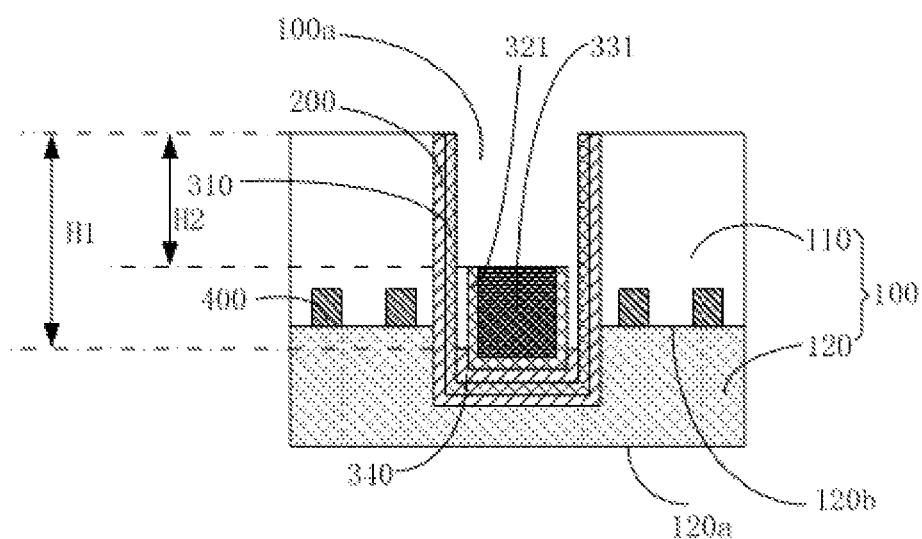
FIG. 15 is a twelfth schematic structural diagram in a semiconductor structure forming process.

At S426, part of the side wall part 3411 is removed, the retained part of the primary isolation layer 341 constitutes the isolation layer 340, and the distance H1 between the top surface of the isolation layer 340 and the opening of the connecting hole 100a is greater than the distance H2 between the top surface of the first sub-layer 321 and the opening of the connecting hole 100a, please referring to FIG. 15.

Figure 16:
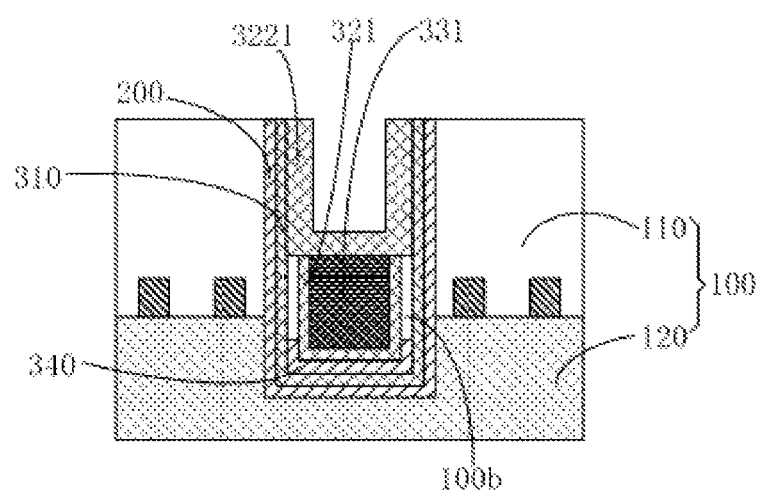
FIG. 16 is a thirteenth schematic structural diagram in a semiconductor structure forming process.

At S427, a second base layer 3221 is formed on the surface of the first barrier layer 310, the surface of the first sub-layer 321 and the surface of the first conductive layer 331, please referring to FIG. 16.

At S428, a second conductive layer 332 is formed, and the second conductive layer 332 and the first conductive layer 331 constitute the conductive structure 330, please referring to FIG. 17, FIG. 18 or FIG. 19.

The processes of S421 to S426 may be similar to that of S411 to S416 in the above embodiment.

The difference is that, after part of the primary conductive layer 3311 and part of the primary barrier layer 3211 are removed in S425, the retained part of the primary barrier layer 3311 constitutes the first sub-layer 321 of the second barrier layer 320, please referring to FIG. 14. The first conductive layer 331 is connected to the first sub-layer 321, and the first sub-layer 321 is located between the first conductive layer 331 and the first barrier layer 321.

In S427, the material of the second base layer 3221 and the material of the first sub-layer 321 may be the same, or of course they may be different.

Meanwhile, the material of the second sub-layer 322 and the material of the first barrier layer 310 may be the same, or of course they may be different.

In S428, the material of the second conductive layer 332 and the material of the first conductive layer 331 may be the same or different. As an example, when the material of the second conductive layer 332 and the material of the first conductive layer 331 are both Cu, the formation process may be similar to that of the first conductive layer 331. The Cu seed crystal layer may be formed at first, and then Cu may be electroplated on the Cu seed crystal layer to form the second conductive layer 332 by further processing.

In an embodiment, please referring to FIG. 17, the second base layer 3221 is used as the second sub-layer 322.

S428 may include that the second conductive layer 332 is formed on the surface of the second sub-layer 322.

Therefore, in the embodiment, the second sub-layer 322 and the first sub-layer 321 constitute the second barrier layer 320, please referring to FIG. 17.

At this time, the second conductive layer 332 fills up the connecting hole 100a. Moreover, the second conductive layer 332 is connected to the second sub-layer 322, and the second conductive layer 332 and the first conductive layer 331 are separated by the second sub 322.

That is, the second sub-layer 322 is between the second conductive layer 332 and the first conductive layer 331. Therefore, the second sub-layer 322 may effectively prevent the possible inconsistency between the second conductive layer 332 and the first conductive layer 331 formed in the two sections due to particle size, etc., and cracks at the interface due to the influence of thermal stress in the subsequent annealing process.

In another embodiment, S428 may include the following operations.

At S4281, at least part of the second base layer 3221 on the surface of the first conductive layer 331 is removed, and the retained part of the second base layer 3221 constitutes the second sub-layer 322.

At S4282, the second conductive layer 332 is formed on the surface of the second sub-layer 322 and the exposed surface of the first conductive layer 331, and the first sub-layer 321 and the second sub-layer 322 constitute the second barrier layer 320, please referring to FIG. 18 or FIG. 19.

In S4281, the second base layer 3221 covering the surface of the first conductive layer 331 may be completely removed, or the second base layer 3221 covering the surface of the first conductive layer 331 may also be partially removed.

In S4282, the second conductive layer 332 fills up the connecting hole. Moreover, the second conductive layer 332 is connected to the second sub-layer 322 and the first conductive layer 331.

In the embodiment, the second conductive layer 332 is connected with the first conductive layer 331 by contact, thereby reducing the contact resistance between the second conductive layer 332 and the first conductive layer 331.

Please referring to FIG. 19, when the second base layer 3221 covering the surface of the first conductive layer 331 is partially removed, the effects of reducing the contact resistance and avoiding the influence of thermal stress between the second conductive layer 332 and the first conductive layer 331 formed in two sections may be considered.

Meanwhile, if the central portion of the second base layer 3221 covering the surface of the first conductive layer 521 is removed and the edge portion is retained, and the retained edge portion may also help to prevent the influence on the inhibition of the thermal expansion stress of the conductive structure 330 inside (including the first conductive layer 331 and the second conductive layer 332) due to the poor contact between the second sub-layer 322 and the first sub-layer.

In the embodiment, the second barrier layer 320 and the conductive structure 330 are formed in two sections to facilitate the formation of the air gap 100b. The first barrier layer 310, the isolation layer 340 and the second barrier layer 320 are arranged together defining the air gap 100b, and the air gap 100b is sealed by the conductive structure 330.

Certainly, in other embodiments, when the first barrier layer 310, the isolation layer 340 and the second barrier layer 320 are arranged together defining the air gap 100b and the air gap 100b is sealed by the conductive structure 330, the forms of the conductive structure 330 and the second barrier layer 320 may also be different.

As an example, the conductive structure 330 may be formed at one time, and the second barrier layer 320 may also be formed at one time.

Alternatively, when the first sub-layer 321 and the second sub-layer 322 of the second barrier layer 320 are formed in two sections, the conductive structure 330 may also be formed at one time, which is not limited in the disclosure.

In an embodiment, the thickness of the second sub-layer 322 is greater than that of the first sub-layer 321, please referring to FIG. 17, FIG. 18 or FIG. 19.

At this time, the affection of the inhibition of the thermal expansion of the conductive structure inside (including the first conductive layer 331 and the second conductive layer 332) due to the poor contact between the second sub-layer 322 and the first sub-layer 321 can be effectively prevented.

Figure 2:
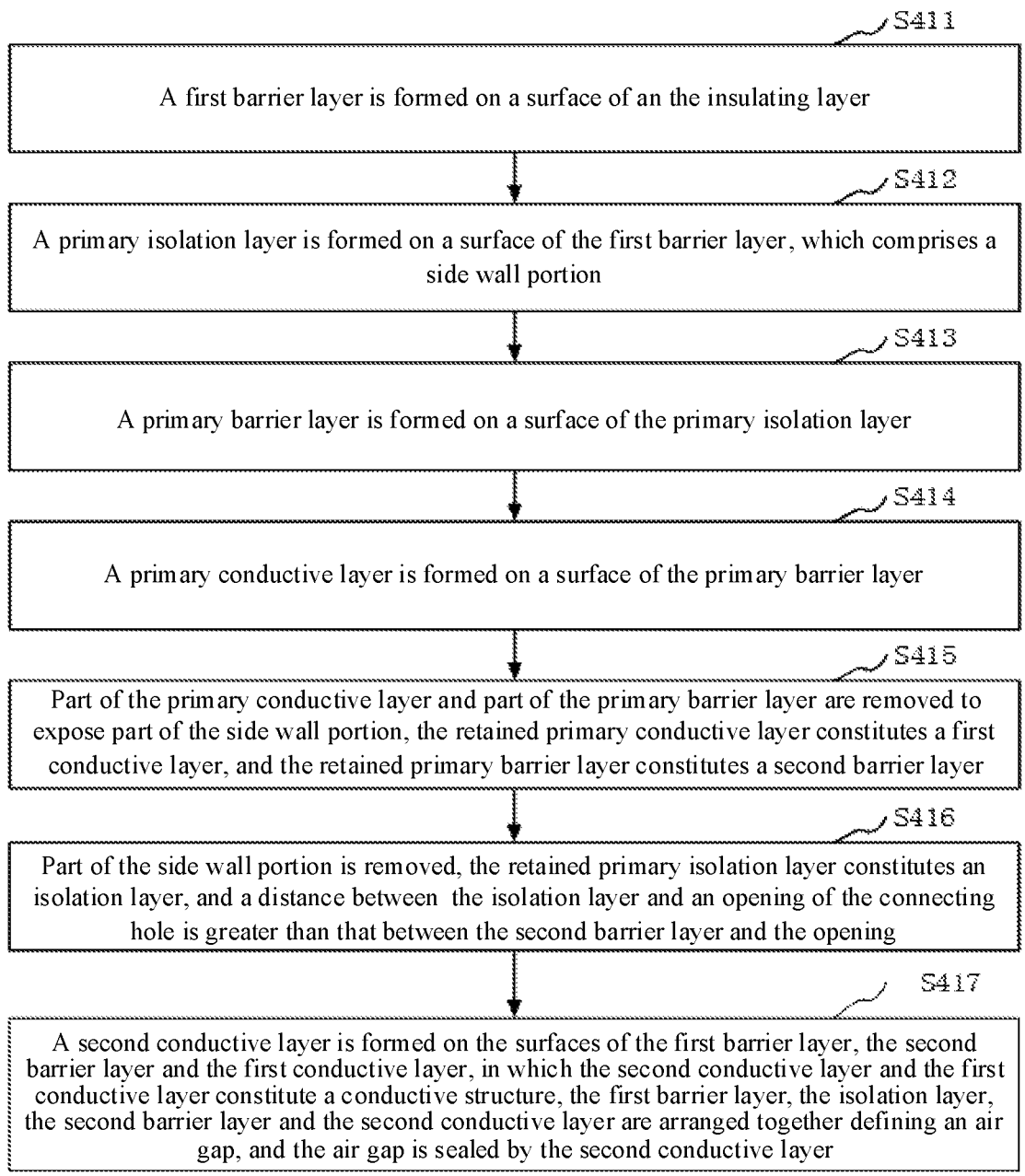
FIG. 2 is a flowchart of a method for forming a semiconductor structure according to another embodiment.
Figure 3:
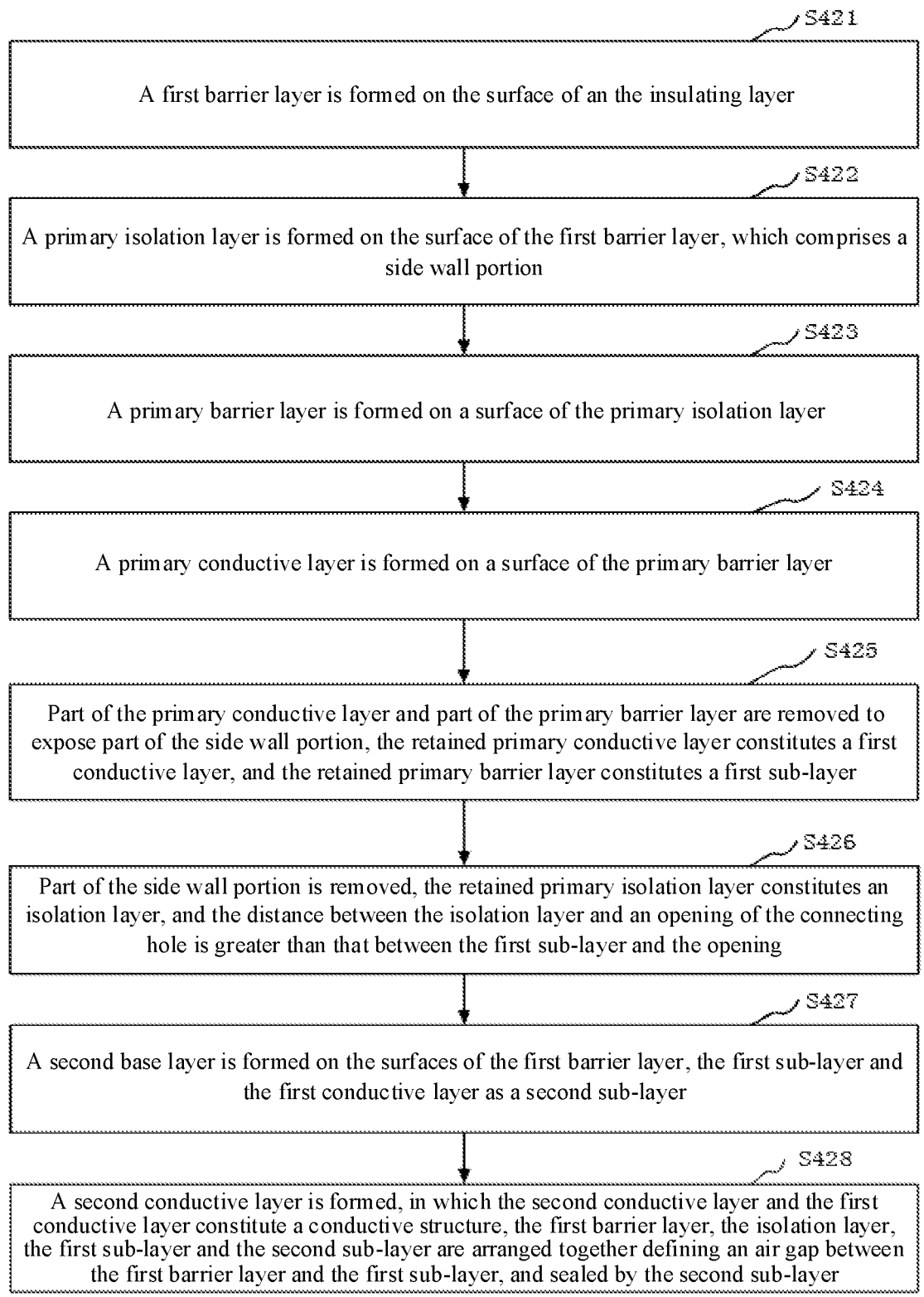
FIG. 3 is a flowchart of a method for forming a semiconductor structure according to yet another embodiment.

Understandably, although various steps in the flowcharts of FIG. 1 to FIG. 3 are sequentially shown by arrows, the steps are not sequentially executed necessarily in the order indicated by the arrows. Unless expressly stated in the description, there are no strict sequence restrictions on the execution of these steps, and these steps may be executed in other orders. Moreover, at least part of steps in FIG. 1 to FIG. 3 may include a plurality of operations or a plurality of stages, which are not executed necessarily at the same time, and may be executed at different times; and are not sequentially executed necessarily, and may be executed in combination with other steps or at least part of operations or stages in other steps in turn or alternately.

In an embodiment, a semiconductor structure is also provided. Please referring to FIG. 17 to FIG. 19, the semiconductor structure includes a base 100, a connecting hole 100a, an insulating layer 200 and a connecting structure 300.

The base 100 includes a substrate 110 and a dielectric layer 120, and the substrate 110 is provided with a front surface 110a and a back surface 110b which are oppositely arranged. The dielectric layer 120 is formed on the front surface 110a. The connecting hole 100a penetrates through the substrate 110 and extends to the dielectric layer 120. The insulating layer 200 is located on the surface of the inner wall of the connecting hole 100a. The connecting structure 300 includes a first barrier layer 310, a second barrier layer 320 and a conductive structure 330. The first barrier layer 310 is located on the surface of the insulating layer 200, the second barrier layer 320 is located between the first barrier layer 310 and the conductive structure 330, and an air gap 100b exists between the second barrier layer 320 and the first barrier layer 310.

In an embodiment, the air gap 100b penetrates through an interface between the substrate 110 and the dielectric layer 120.

In an embodiment, the width of the portion of the air gap 100b corresponding to the dielectric layer 120 is less than the width of the portion corresponding to the substrate 110.

In an embodiment, the connecting structure 300 may also include an isolation layer 340. The isolation layer 340 is located between the first barrier layer 310 and the second barrier layer 320. The first barrier layer 310, the isolation layer 340, the second barrier layer 320 and the conductive structure 330 are arranged together defining the air gap 100b, and the air gap 100b is sealed by the conductive structure 330.

Furthermore, in the embodiment, the conductive structure 330 may include a first conductive layer 331 and a second conductive layer 332 which are interconnected. The first conductive layer 331 and the second conductive layer 332 are formed in two processes. The first conductive layer 331 is connected to the second barrier layer 320. The second barrier layer 320 is located between the first conductive layer 331 and the first barrier layer 310. The second conductive layer 332 is connected to the first barrier layer 310, the second barrier layer 320 and the first conductive layer 331.

At this time, the first barrier layer 310, the isolation layer 340, the second barrier layer 320 and the second conductive layer 332 are arranged together defining the air gap 100b, and the air gap 100b is sealed by the second conductive layer 332.

Certainly, the conductive structure 330 may also be formed in a single process. There is no limitation in the disclosure.

In an embodiment, the connecting structure 300 may also include an isolation layer 340. The isolation layer 340 is located between the first barrier layer 310 and the second barrier layer 320. The first barrier layer 310, the isolation layer 340 and the second barrier layer 320 are arranged together defining the air gap 100b.

In an embodiment, the second barrier layer 320 may include a first sub-layer 321 and a second sub-layer 322, which are interconnected. The air gap 100b is located between the first barrier layer 310 and the first sub-layer 321, and the air gap is sealed by the second sub-layer 322.

In an embodiment, the conductive structure 330 may include a first conductive layer 331 and a second conductive layer 332. The first conductive layer 331 is connected to the first sub-layer 321. The first sub-layer 321 is located between the first conductive layer 331 and the first barrier layer 310. The second conductive layer 332 is connected to the second sub-layer 332. The second sub-layer 332 is located between the second conductive layer 332 and the first barrier layer 310.

In an embodiment, a second sub-layer 322 is formed on the surface of the first barrier layer 310, the surface of the first sub-layer 321 and the surface of the first conductive layer 331.

In an embodiment, the thickness of the second sub-layer 322 is greater than that of the first sub-layer 321.

In an embodiment, please referring to FIG. 17, the second conductive layer 332 fills up the connecting hole 100a, and the second conductive layer 332 and the first conductive layer 331 are separated by the second sub-layer 322.

In an embodiment, the second conductive layer 332 fills up the connecting hole 100a, and is connected to the first conductive layer 331, please referring to FIG. 18 or FIG. 19.

At this time, part of the second sub-layer 322 may be provided between the first conductive layer 331 and the second conductive layer 332. For example, the second sub-layer 322 may be provided at the edge of the second conductive layer 332 and located between the second conductive layer 332 and the first conductive layer 331, please referring to FIG. 19.

The specific definition and technical effect of the semiconductor structure may refer to the above definition of the method for forming the semiconductor structure, which will not be elaborated here.

Certainly, it should be understood that, the semiconductor structure of the disclosure is not limited to the method for forming the semiconductor structure in the above embodiment.

In an embodiment, a stacked structure is further provided. The stacked structure is formed by processing based on the semiconductor structure described in any one of the above.

Specifically, when the stacked structure is formed, the above semiconductor structure needs to be subjected to processing such as etching or planarization to expose the conductive structure 330 in the dielectric layer 120 (not shown in the drawings), therefore, the conductive structure 330 in the connecting hole 100a may be electrically connected for signal transmission when it is stacked with adjacent semiconductor structures.

In the descriptions of the specification, the descriptions made with reference to terms "an embodiment", "an ideal embodiment" or the like refer to that specific features, structures, materials or characteristics described in combination with the embodiment or the example are included in at least one embodiment or example of the disclosure. In the specification, schematic description on the above terms not always refers to same embodiments or examples.

Each technical feature of the above embodiments may be combined freely. For simplicity of description, not all possible combinations of each technical solution in the above embodiments are described. However, any combination of these technical features shall fall within the scope recorded in the specification without conflicting.

The above-mentioned embodiments only express some implementation of the disclosure and are specifically described in detail and not thus understood as limits to the patent scope of the disclosure. It is to be pointed out that those of ordinary skill in the art may further make a plurality of transformations and improvements without departing from the concept of the disclosure and all of these shall fall within the scope of protection of the disclosure. Therefore, the scope of patent protection of the disclosure should be subject to the appended claims.

What is claimed is:

1. A semiconductor structure, comprising:
   a base, comprising a substrate and a dielectric layer, wherein the substrate has a front surface and a back surface which are oppositely arranged, and the dielectric layer is located on the front surface;
   a connecting hole, penetrating through the substrate and extending to the dielectric layer;
   an insulating layer, located on a surface of an inner wall of the connecting hole; and
   a connecting structure, comprising a first barrier layer, a second barrier layer and a conductive structure, wherein the first barrier layer is located on a surface of the insulating layer, the second barrier layer is located between the first barrier layer and the conductive structure, and an air gap exists between the second barrier layer and the first barrier layer, wherein
   the connecting structure further comprises an isolation layer, the isolation layer is located between the first barrier layer and the second barrier layer, and the first barrier layer, the isolation layer and the second barrier layer are arranged together defining the air gap.

2. The semiconductor structure according to claim 1, wherein
   the air gap penetrates through an interface between the substrate and the dielectric layer.

3. The semiconductor structure according to claim 2, wherein
   a width of a portion of the air gap corresponding to the dielectric layer is less than a width of a portion corresponding to the substrate.

4. The semiconductor structure according to claim 1, wherein
   the first barrier layer, the isolation layer, the second barrier layer and the conductive structure are arranged together defining the air gap, and the air gap is sealed by the conductive structure.

5. The semiconductor structure according to claim 1, wherein
   the second barrier layer comprises a first sub-layer and a second sub-layer which are interconnected, the air gap is located between the first barrier layer and the first sub-layer, and the air gap is sealed by the second sub-layer.

6. The semiconductor structure according to claim 5, wherein
   the conductive structure comprises a first conductive layer and a second conductive layer, the first conductive layer is connected to the first sub-layer, wherein the first sub-layer is located between the first conductive layer and the first barrier layer, the second conductive layer is connected to the second sub-layer, and the second sub-layer is located between the second conductive layer and the first barrier layer.

7. The semiconductor structure according to claim 6, wherein
   the second conductive layer fills up the connecting hole, and the second conductive layer and the first conductive layer are separated by the second sub-layer.

8. The semiconductor structure according to claim 6, wherein
   the second conductive layer fills up the connecting hole, and is connected to the first conductive layer.

9. The semiconductor structure according to claim 8, wherein
   a thickness of the second sub-layer is greater than a thickness of the first sub-layer.

10. A method for forming a semiconductor structure, comprising:
    providing a base, wherein the base comprises a substrate and a dielectric layer, the substrate is provided with a front surface and a back surface which are oppositely arranged, and the dielectric layer is formed on the front surface;
    forming a connecting hole in the base, wherein the connecting hole penetrates through the substrate and extending to the dielectric layer;
    forming an insulating layer on a surface of an inner wall of the connecting hole; and
    forming a connecting structure on a surface of the insulating layer, wherein the connecting structure comprises a first barrier layer, a second barrier layer and a conductive structure, the first barrier layer is located on the surface of the insulating layer, the second barrier layer is located between the first barrier layer and the conductive structure, and an air gap exists between the second barrier layer and the first barrier layer, wherein
    the connecting structure further comprises an isolation layer, and said forming the connecting structure on the surface of the insulating layer comprises:
    forming a first barrier layer on the surface of the insulating layer;
    forming a primary isolation layer on a surface of the first barrier layer, wherein the primary isolation layer comprises a side wall portion;
    forming a primary barrier layer on a surface of the primary isolation layer;
    forming a primary conductive layer on a surface of the primary barrier layer;
    removing part of the primary conductive layer and part of the primary barrier layer so as to expose part of the side wall portion, wherein the retained part of the primary conductive layer constitutes a first conductive layer, and the retained part of the primary barrier layer constitutes a first sub-layer;
    removing part of the side wall portion, wherein the retained part of the primary isolation layer constitutes an isolation layer, and a distance between a top surface of the isolation layer and an opening of the connecting hole is greater than a distance between a top surface of the first sub-layer and the opening of the connecting hole;
    forming a second base layer on the surface of the first barrier layer, a surface of the first sub-layer and a surface of the first conductive layer; and
    forming a second conductive layer, wherein the second conductive layer and the first conductive layer constitutes the conductive structure.

11. The method according to claim 10, wherein
forming the connecting hole in the base comprises: etching the base from the back surface of the substrate to form the connecting hole.

12. The method according to claim 10, wherein
the air gap penetrates through an interface between the substrate and the dielectric layer.

13. The method according to claim 12, wherein
a width of a portion of the air gap corresponding to the dielectric layer is less than a width of a portion corresponding to the substrate.

14. The method according to claim 10, wherein
the second base layer is used as a second sub-layer, and said forming of the second conductive layer comprises:
forming the second conductive layer on a surface of the second sub-layer, wherein the second sub-layer and the first sub-layer constitutes the second barrier layer.

15. The method according to claim 10, wherein
said forming of the second conductive layer comprises:
removing at least part of the second base layer on the surface of the first conductive layer, wherein the retained part of the second base layer constitutes a second sub-layer; and
forming the second conductive layer on the surface of the second sub-layer and the exposed surface of the first conductive layer, wherein the first sub-layer and the second sub-layer constitutes the second barrier layer.

16. The method according to claim 15, wherein
a thickness of the second sub-layer is greater than a thickness of the first sub-layer.

17. A semiconductor structure, comprising:
a base, comprising a substrate and a dielectric layer, wherein the substrate has a front surface and a back surface which are oppositely arranged, and the dielectric layer is located on the front surface;
a connecting hole, penetrating through the substrate and extending to the dielectric layer;
an insulating layer, located on a surface of an inner wall of the connecting hole; and
a connecting structure, comprising a first barrier layer, a second barrier layer and a conductive structure, wherein the first barrier layer is located on a surface of the insulating layer, the second barrier layer is located between the first barrier layer and the conductive structure, and an air gap exists between the second barrier layer and the first barrier layer, wherein
the connecting structure further comprises an isolation layer, the isolation layer is located between the first barrier layer and the second barrier layer, the first barrier layer, the isolation layer, the second barrier layer and the conductive structure are arranged together defining the air gap, and the air gap is sealed by the conductive structure.

* * * * *